US 6,649,443 B2

(12) United States Patent
Gektin

(10) Patent No.: US 6,649,443 B2
(45) Date of Patent: Nov. 18, 2003

(54) SYSTEM FOR FACILITATING ALIGNMENT OF SILICON DIE

(75) Inventor: Vadim Gektin, San Jose, CA (US)

(73) Assignee: Sun Microsystems, Inc., Palo Alto, CA (US)

( * ) Notice: Subject to any disclaimer, the term of this patent is extended or adjusted under 35 U.S.C. 154(b) by 0 days.

(21) Appl. No.: 09/965,704

(22) Filed: Sep. 26, 2001

(65) Prior Publication Data

US 2003/0057575 A1 Mar. 27, 2003

(51) Int. Cl.$^7$ .......................... H05K 7/20; H01L 21/68
(52) U.S. Cl. ........................................ 438/106; 324/719
(58) Field of Search .............................. 257/713, 718; 438/106, 122; 361/719

(56) References Cited

U.S. PATENT DOCUMENTS 5,882,459 A * 3/1999 Petefish et al. ............. 156/150
5,926,371 A * 7/1999 Dolbear ..................... 361/704
6,349,032 B1 * 2/2002 Chan et al. ................. 361/704

FOREIGN PATENT DOCUMENTS

JP        2000-174157 A  *  6/2000  .......... H01L/23/12

* cited by examiner

*Primary Examiner*—Evan Pert
(74) *Attorney, Agent, or Firm*—Hamilton & Terrile LLP; Stephen A. Terrile

(57) ABSTRACT

In accordance with the present invention, a method is described which facilitates heat transfer from a silicon die after the silicon die is bonded to a substrate. An alignment tool is used to align the spacer with the silicon die. A thermal conductor can be placed on the silicon layer after the silicon layer has been bonded to the substrate layer. A die interface material is not necessarily applied between the silicon die and the thermal conductor. A spacer is used between the substrate and the thermal conductor. The spacer can facilitate heat transfer from the die. The spacer can facilitate force transfer from the thermal lid to the die. The spacer allows a thermal conductor to be affixed to the silicon die without use of a die interface. An alignment tool is used to align the spacer with the silicon die.

18 Claims, 14 Drawing Sheets

SYSTEM FOR FACILITATING ALIGNMENT OF SILICON DIE

CROSS-REFERENCE TO RELATED APPLICATIONS

This application relates to co-pending U.S. patent application Ser. No. 09/865,903, filed on May 25, 2001, entitled "A Method to Place a Thermal Interface when Manufacturing an Integrated Circuit" naming Vadim Gektin as inventor, which is assigned to the assignee of this application, the application being hereby incorporated by reference in its entirety.

This application relates to co-pending U.S. patent application Ser. No. 09/950,204, filed on Sep. 10, 2001, entitled "Facilitating Heat Transfer from an Integrated Circuit Package" naming Vadim Gektin as inventor, which is assigned to the assignee of this application, the application being hereby incorporated herein by reference in its entirety.

BACKGROUND OF THE INVENTION

1. Field of the Invention

The present invention relates to manufacturing integrated circuits packages. More specifically, the invention relates to aligning a spacer to a silicon die.

2. Description of the Related Art

Digital circuits, no matter how complex, are composed of a small group of identical building blocks. These blocks can be gates or special circuits or other structures for which gates are less suitable. But the majority of digital circuits are composed of gates or combinations of gates. Gates are combinations of high-speed electronic switches, such as transistors.

A microprocessor is a central processing unit of a computer or other device using thousands (or millions) of gates, flip-flops and memory cells. Flip-flops and memory cells are modified versions of basic logic gates.

It is known to manufacture an integrated circuit using conductors separated by a semiconductor. Circuits are fabricated on a semiconductor by selectively altering the conductivity of the semiconductor material. Various conductivity levels correspond to elements of a transistor, diode, resistor, or small capacitor. Individual components such as transistors, diodes, resistors, and small capacitors are formed on small chips of silicon. These individual components are interconnected by wiring patterns (typically aluminum, copper or gold).

An integrated circuit is then included in a larger structure, known as integrated circuit package, that provides electrical connections between the integrated circuit and the next level assembly. The integrated circuit package also serves structural functions. Integrated circuit packages are then mounted on printed (or wired) circuit boards, which are used to assemble electronic systems such as personal computers and other data processing equipment.

It is known to manufacture an integrated circuit package using a layer of silicon and a layer of a substrate. The substrate layer can be ceramic or another material with the necessary electrical insulating properties, such as a ceramic. Heat is applied during the manufacturing process to bond the silicon layer to the substrate layer. Uneven cooling of the silicon and substrate layers (sometimes referred to as the "package") could produce failures in the package. Uniform cooling minimizes the number of failures in the package.

After bonding the silicon layer to the substrate layer a heat spreader (sometimes referred to as a "thermal lid" or simply a "lid") is attached to the package. The thermal lid serves to conduct heat from the integrated circuit package to the environment and thus facilitates even cooling. The lid is typically formed from a metal due to the high thermal conductivity of metals. Typically, neither the thermal lid nor the silicon surface is sufficiently flat to provide an efficient heat exchange interface. Thus, imperfections in the surface of the thermal lid and the surface of the silicon prevent complete surface contact between the surface of the silicon and the surface of the thermal lid. The incomplete surface contact is an impediment to heat transfer, which in turn causes failures of the package.

The lid can be used in conjunction with a heat sink. The heat sink is provided with fins or other external surfaces to increase contact with ambient air. The increased contact with the ambient air further facilitates heat transfer.

The lid also serves to promote even transfer of forces to the package. Even transfer of force to the package prevents force concentrations on the silicon layer, substrate or in some circumstances the printed circuit board. Even force transfer also reduces failures of the package.

To facilitate surface contact between the thermal lid and the silicon surface a thermal interface material (sometimes referred to as a "die interface material") is employed. The die interface material can be applied to the surface of the silicon before the thermal lid is attached. The die interface material is not necessarily a solid and can conform to imperfections in the surface of the silicon. Similarly, the die interface material can conform to imperfections in the surface of the thermal lid. Thus, using a die interface material increases the surface contact between the silicon and the thermal lid and promotes heat transfer.

An example of a material that is suitable for a thermal interface material is manufactured by Thermagon of Cleveland, Ohio. This specific material, referred to as T-lma-60, has suitable thermal conductive properties and can be used as a thermal interface material. T-lma-60 can have more than one layer and is a thermal conductive structure phase change material. T-lma-60 changes phase from solid to liquid at approximately 60° C. A thermal interface material, such as T-lma-60 or other, can have a plurality of layers. For example, a thermal interface material such as T-lma-60 can have three layers, one of which can be a metallic central layer.

The increased surface contact between the silicon surface and lid has an additional benefit. When the lid is applied to the silicon layer a force is transferred. If the force is not uniformly transferred, failures of the silicon can result. Failures of the silicon surface can result in rejected packages or later failures.

When a heat sink is employed it is also known to utilize a heat sink interface material. Similar in material characteristic to a die interface material, a heat sink interface material is not necessarily a solid. Similar in function to a die interface material, a heat sink interface material also improves heat transfer properties by improving surface contact between the heat sink and the lid. Similar to the die interface material the heat sink interface material improves force transfer by increasing surface contact between the heat sink and the lid.

FIG. 1A depicts substrate 120 adjacent to printed circuit board (sometimes referred to as "pcb") 110. Silicon die 130 is bonded to substrate 120 as previously discussed. Die interface material 150 is a non-solid used to facilitate heat transfer between silicon die 130 and lid 140. Lid 140 contacts heat sink interface material 160 as shown. Heat sink interface material 160 contacts heat sink 170 as shown. Lid interface material 180 is used to facilitate heat transfer between silicon die 130 and substrate 120. FIG. 1B depicts a thermal lid with a cavity depth of zero. As depicted in FIG. 1B, lid interface material 180 is not typically used for applications having a zero cavity thermal lid due to the lack of surface contact between thermal lid 140 and substrate 120.

FIG. 1C also depicts the related art of facilitating heat transfer from a silicon die. As shown in FIG. 1C, die interface material 150 is again employed. However, in the application as depicted in FIG. 1C neither a thermal lid nor a heat sink interface material are employed (as shown previously in FIG. 1B). Still referring to FIG. 1C, die interface material 150 is employed to improve the surface contact between silicon die 130 and heat sink 170. In the application shown in FIG. 1C the heat sink 170 directly contacts die interface material 150.

FIG. 2A depicts the logical steps of placing die interface material 150 on silicon die 130. As shown in FIG. 2A, the method begins with start 210. From start 210 the logical steps include providing substrate, providing silicon die 220 and providing thermal lid 240. After providing silicon die 220 and providing substrate 230 the silicon die 130 and substrate 120 are bonded, 250. Provide thermal lid 240 is shown occurring prior to bonding (250) silicon die 130 to substrate 120 but can occur later. After providing thermal lid 240 die interface material 150 is placed (260) on silicon die 130. After die interface material 150 is place (260) on silicon die 130 thermal lid 140 is placed (270) on die interface material 150. In one method, after the thermal lid and organic thermal interface material are placed on the silicon layer 270, the process ends 295.

Another embodiment is represented in FIG. 2B. In the embodiment represented in FIG. 2B, heat sink 170 is provided, 255. When a heat sink is provided heat sink interface material 160 is also provided, 265. As shown in FIG. 2B, heat sink interface material 160 is placed (280) on thermal lid 140 after the thermal lid is placed (270) on the silicon die. As further shown in FIG. 2B, heat sink 170 is placed (290) on thermal interface material 160 after heat sink interface material 160 is placed (280) on the thermal lid.

Although FIG. 2B depicts providing heat sink 170 and heat sink interface material 160 after bonding (250) heat sink 170 and heat sink interface material 160 can be provided earlier or later in the process. For example, referring to FIG. 2C, providing heat sink 255 and providing the heat sink interface material 265 occur after placing (260) die interface material on silicon die.

FIG. 2D depicts use of a heat sink, without using a thermal lid. Thus, providing a thermal lid (step 240) and providing heat sink interface material (step 265) are not shown. As shown previously (refer to FIG. 2C) providing substrate 230, providing silicon die 220 and providing heat sink 255 are again shown. From providing silicon die 220 the method can proceed to bonding silicon die and substrate, 250. As previously shown (refer to FIG. 2C) the method can proceed from bonding silicon die and substrate 250 to placing die interface material on silicon die, 260. After the die interface material is placed on the silicon die (260) the method can proceed to placing heat sink on the die interface, 295. In application shown in FIG. 2D, a heat sink is used to facilitate heat transfer, but a thermal lid is not used.

The following components contribute to the total thermal resistance of the package: heat sink, heat sink interface material, thermal lid, die interface material, silicon die and substrate. Thus heat transfer is constrained by the number of components and the thermal conductivity and physical characteristics (such as thickness) of those components. What is needed is a method of improving the thermal resistance of the package.

SUMMARY OF THE INVENTION

In accordance with the present invention, a method is described which facilitates heat transfer from a silicon die after the silicon die is bonded to a substrate. An alignment tool is used to align the spacer with the silicon die. A thermal conductor (such as a thermal lid or heat sink) is placed on the silicon layer after the silicon layer has been bonded to the substrate layer. A die interface material is not necessarily applied between the silicon die and the thermal conductor. A spacer is used between the substrate and the thermal conductor. The spacer can facilitate heat transfer from the die. The spacer facilitates force transfer from the thermal to the die. The spacer can allow a thermal conductor to be affixed to the silicon die without use of a die interface material. An alignment tool is used to align the spacer with the silicon die.

The specification also teaches an integrated circuit package manufactured by the method taught. The specification also teaches a computer system including an integrated circuit package manufactured by the method taught. The specification also teaches a computer system including an integrated circuit package manufactured by the method taught.

The foregoing is a summary and this contains, by necessity, simplifications, generalizations and omissions of detail; consequently, those skilled in the art will appreciate that the summary is illustrative only and is not intended to be in any way limiting.

BRIEF DESCRIPTION OF THE DRAWINGS

The present invention may be better understood, and its numerous objects, features and advantages made apparent to those skilled in the art by referencing the accompanying drawings. The use of the same reference number throughout the several figures designates a like or similar element.

FIG. 2A depicts the logical steps of the related art of placing a die interface material on the silicon die before the thermal lid is placed.

FIG. 4A depicts the logical step of providing (and placing) a spacer and placing the thermal lid on the silicon die.

DETAILED DESCRIPTION

The following sets forth a detailed description of a mode for carrying out the invention. The description is intended to be illustrative of the invention and should not be taken to be limiting. A method is taught of aligning a spacer to a silicon die. The disclosure also includes a tool, or other means, for aligning a spacer to the silicon die. The spacer is used to maintain the close tolerances required for conductive cooling from the silicon die to the thermal conductor. Because the spacer maintains the spacing required for sufficient surface contact between the silicon die and the thermal conductor, the die interface material can be omitted. Omitting the die interface material from between the silicon die and the thermal conductor increases thermal conductance from the silicon die to the thermal conductor. Increasing thermal transfer from the silicon die cools the die more efficiently and reduces thermally-driven failures. Also, using the spacer maintains force distribution from the thermal conductor to the die and substrate.

Figure 1A:
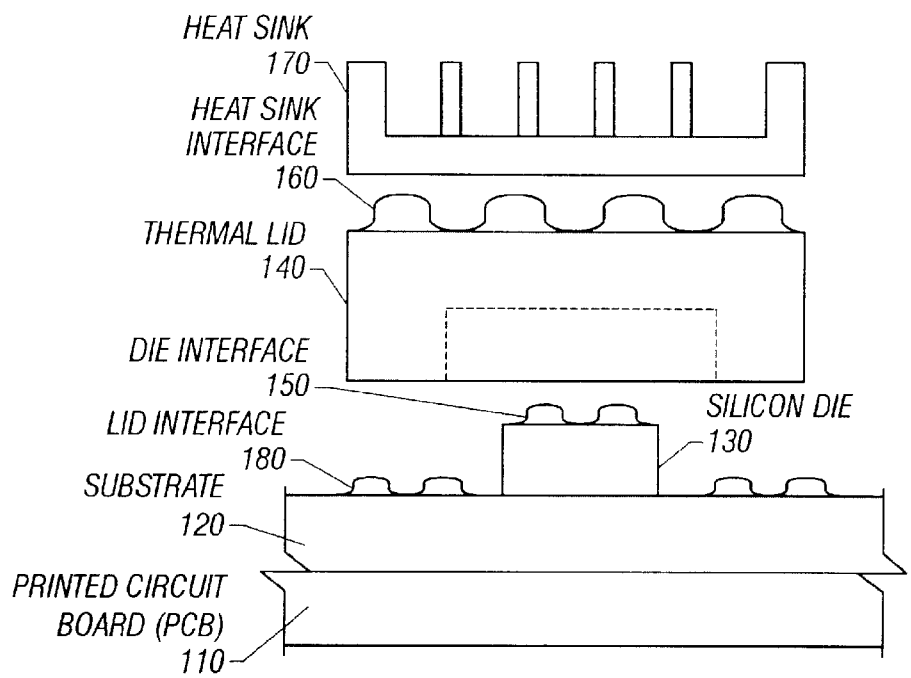
FIG. 1A depicts the related art of placing an organic thermal interface material on a silicon layer after the silicon layer is bonded to the substrate.
Figure 3A:
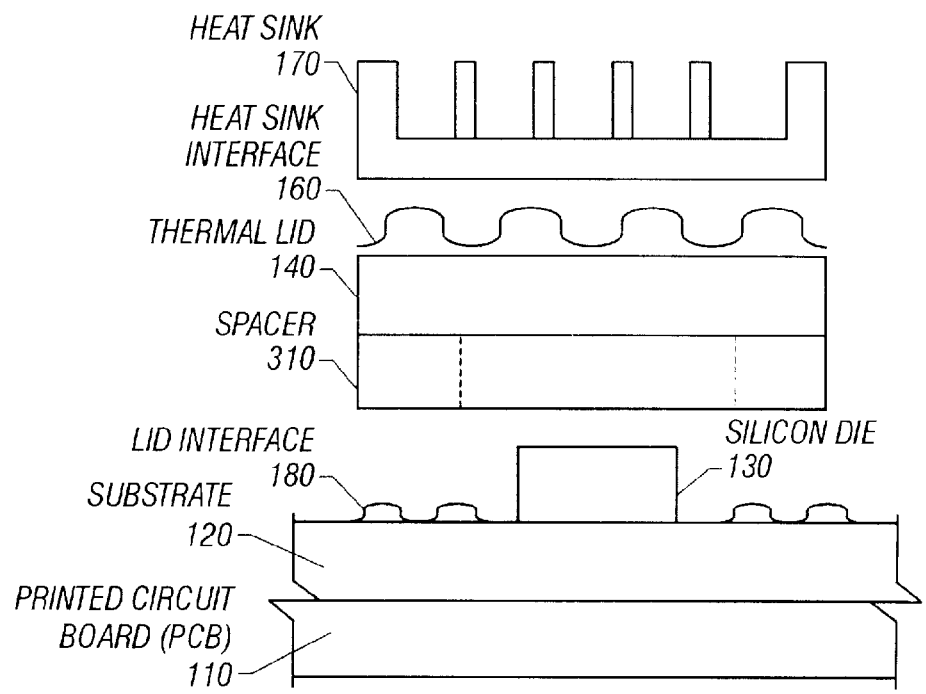
FIG. 3A depicts placing a thermal lid on the silicon die without using a die interface material.

FIG. 3A depicts printed circuit board 110 and substrate 120 previously shown in FIG. 1A. FIG. 3A also depicts spacer 310 and thermal lid 140 as previously shown in FIG. 1A. However, FIG. 3A is not limiting. For example thermal lid 140 can be any thermal conductor, such as a heat sink 160 (previously shown in FIG. 1A).

FIG. 3A also depicts heat sink interface material 160 and heat sink 170 as previously shown in FIG. 1A. However, FIG. 3A does not depict a die interface material between silicon die 130 and thermal lid 140. Located between silicon die 130 and thermal lid 140 FIG. 3A depicts spacer 310. Spacer 310 is a solid suitable for transmitting a force from thermal lid 140 (or heat sink 170) to substrate 120. Typically, spacer 310 is expected to be metallic or an alloy, but spacer 310 can be any suitable material. For example, spacer 310 can be a liquid which solidifies (sometime said to "cure") after the material is placed. Spacer 310 does not necessarily conduct heat from the silicon die. Therefore, the material for thermal conductivity of spacer 310 is not limited to materials having a high (or low) thermal conductivity. However, spacer 310 shall be of a material suitable to transfer a force from thermal lid 140 (or heat sink 170) to substrate 120.

Figure 3B:
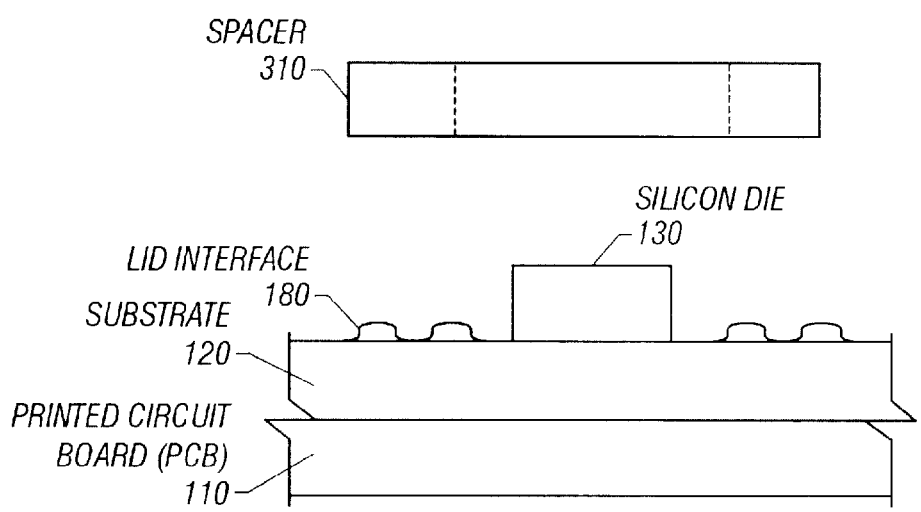
FIG. 3B again depicts placing a spacer on the silicon die without using a thermal lid as previously shown in FIG. 3A.

FIG. 3B depicts silicon die 130 and spacer 310 on substrate 120 as previously depicted in FIG. 3A. However, for clarity heat sink 170, heat sink interface material 160 and thermal lid 140 are not shown in FIG. 3B. When spacer 310 is placed on substrate 120 the top surface of silicon die 130 and spacer 310 will be at a predetermined height variance. The predetermined height variance can include a zero variance. Maintaining the top surface of spacer 310 and the top surface of silicon die 130 at the predetermined height variance enhances the heat transfer from silicon die 130 to heat sink 170 (not shown) as previously shown in FIG. 3A.

Figure 2A:
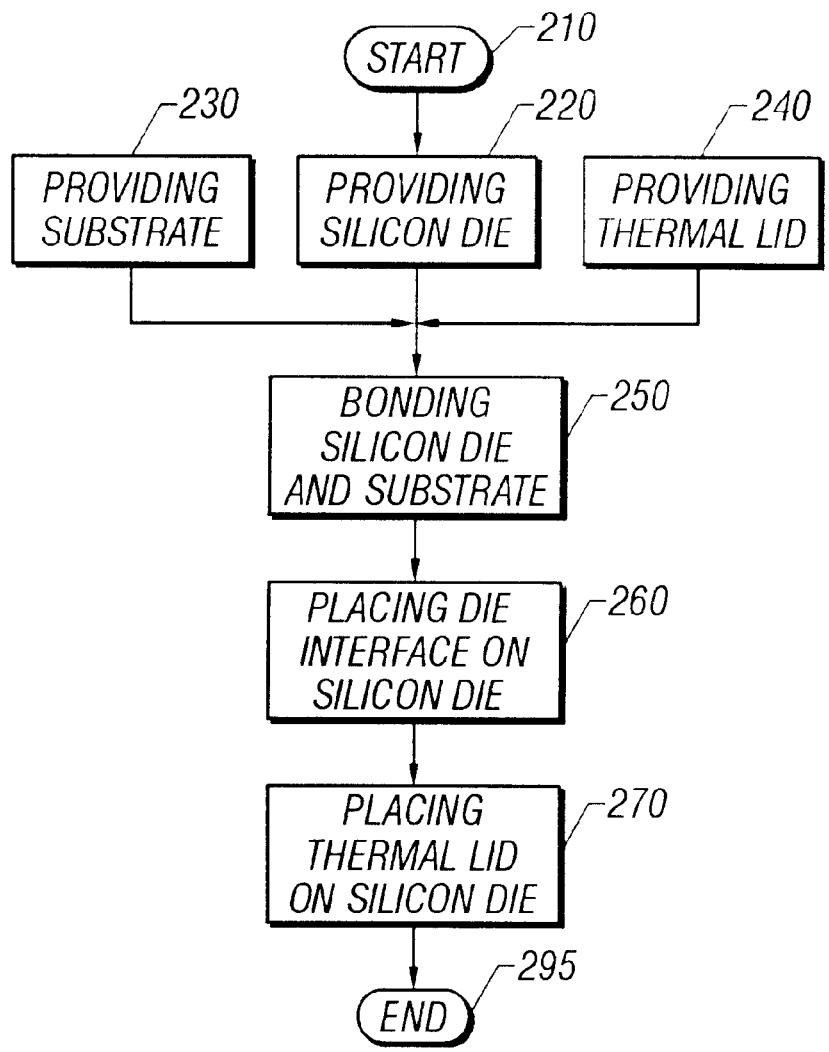
FIG. 2A depicts a process flow diagram depicting logical steps of the related art. Specifically.
Figure 2B:
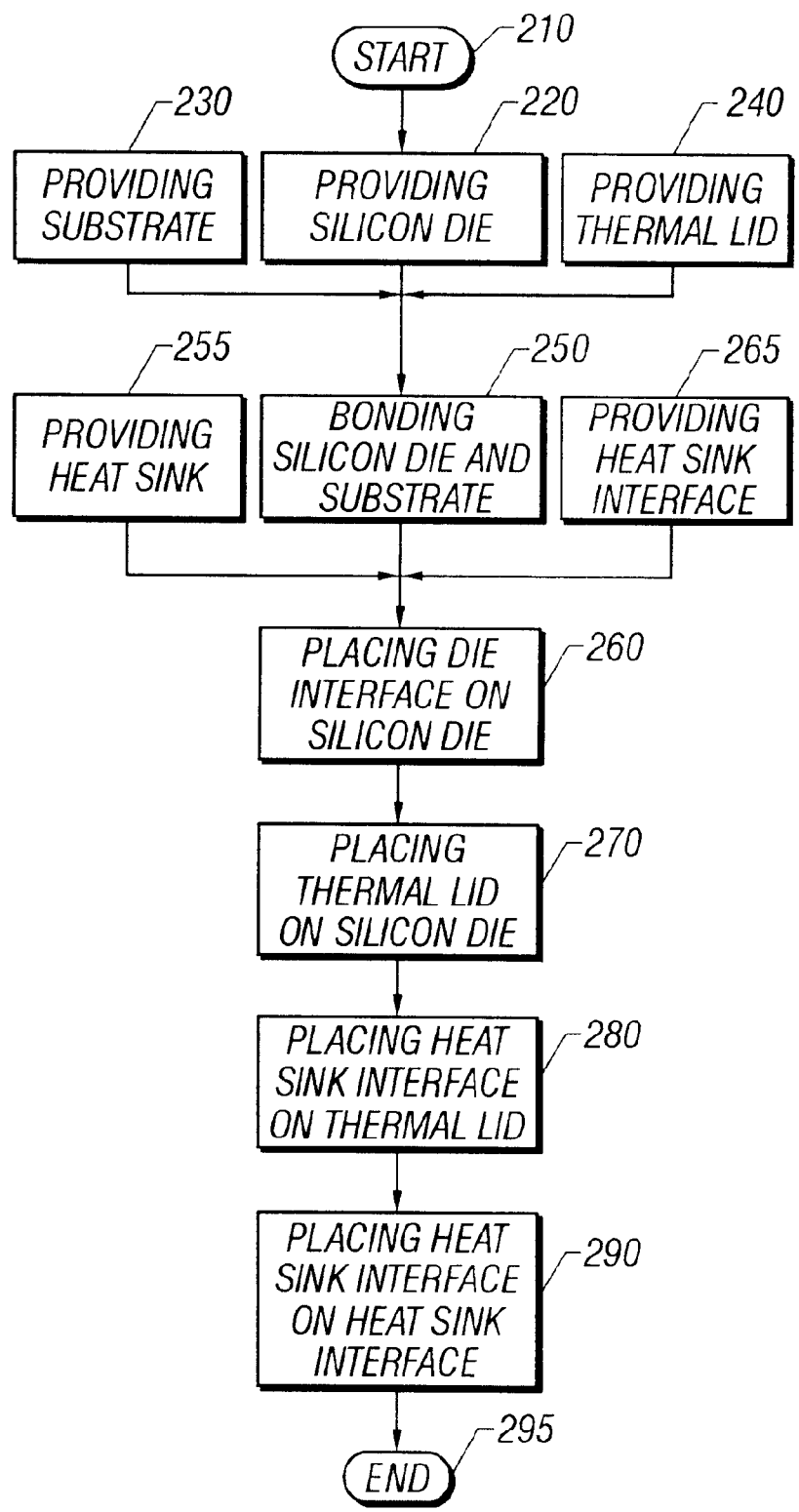
FIG. 2B depicts another step in the method previously shown in FIG. 2A, placing a heat sink and heat sink interface material on a thermal lid.
Figure 2C:
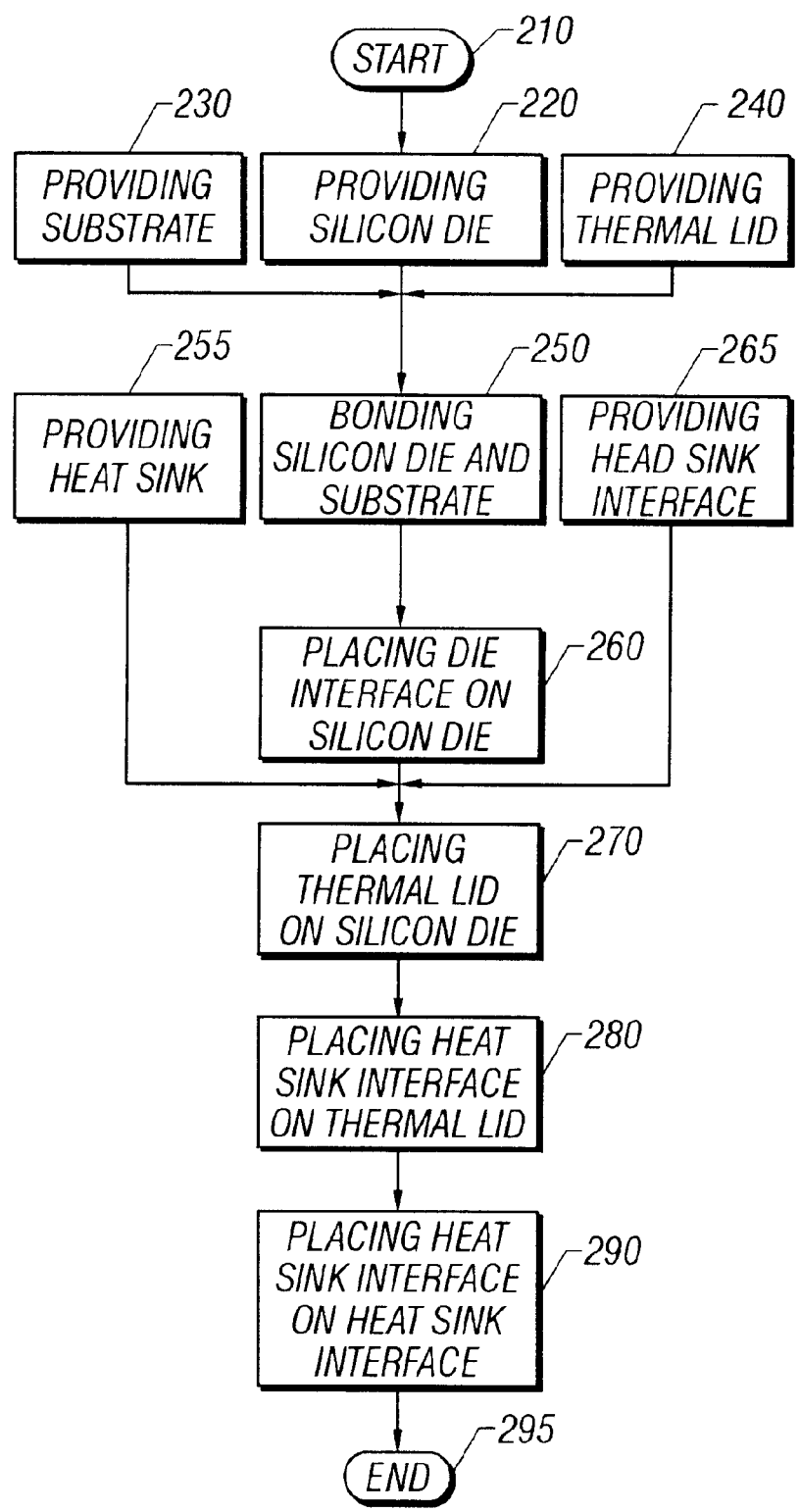
FIG. 2C depicts an embodiment of the related art placing the heat sink and heat sink interface material on a thermal lid (as previously shown in FIG. 2B) after placing the die interface material on the silicon die.
Figure 2D:
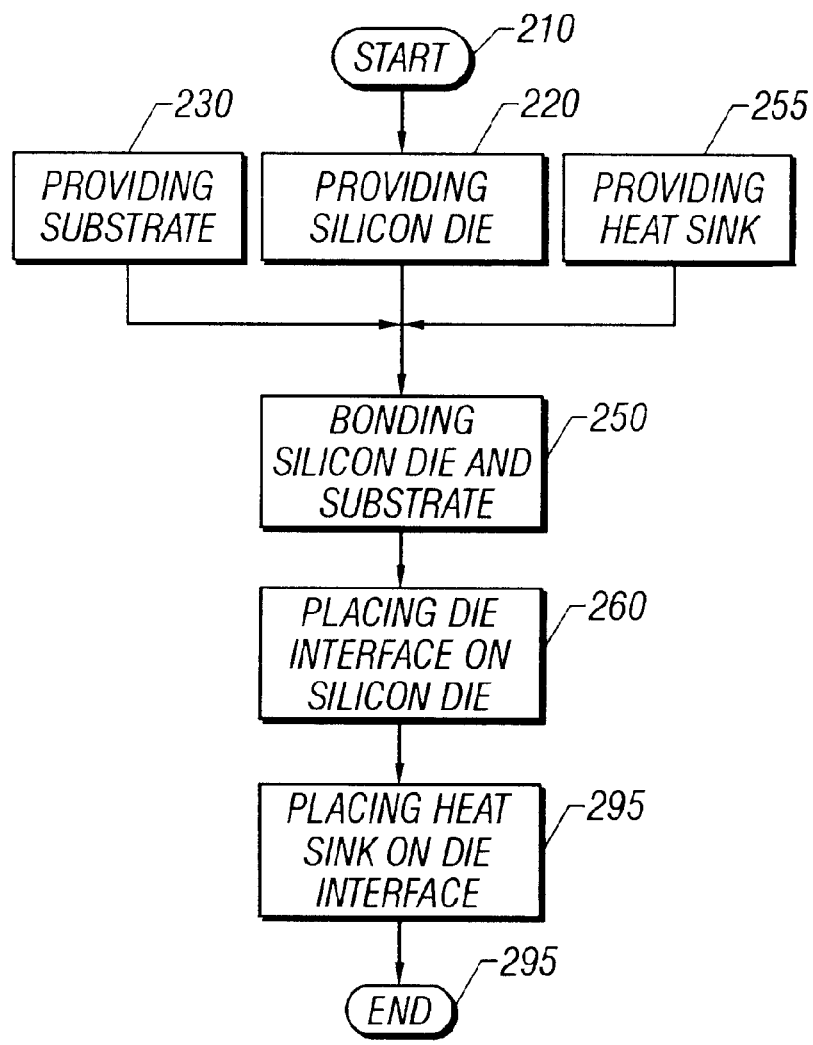
FIG. 2D depicts placing a heat sink on the silicon die without using a thermal lid.
Figure 4A:
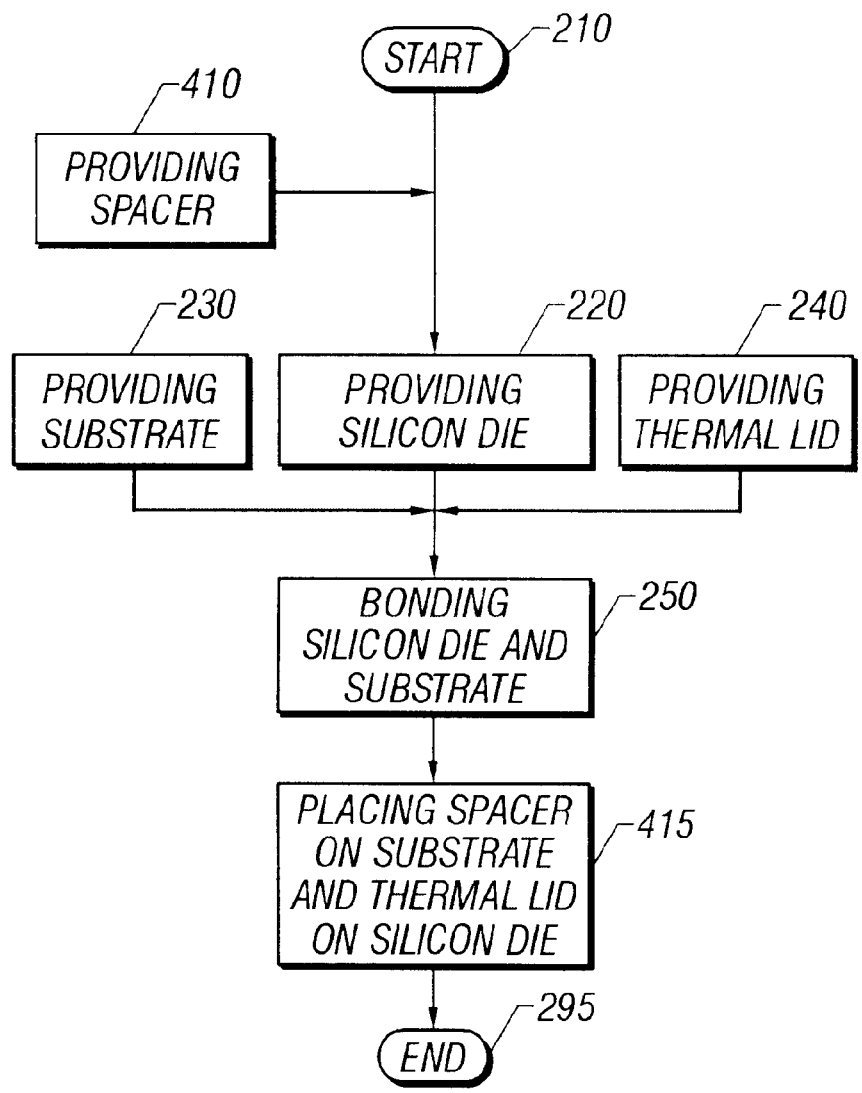
FIG. 4A depicts a process flow diagram depicting logical steps of an embodiment. Specifically.

FIG. 4A depicts the logical steps of placing thermal lid 140 on silicon die 130 without use of die interface material 150 (previously shown in FIGS. 2A–2C). Thus, FIG. 4A shows steps previously shown in FIG. 2A such as providing silicon die 220, providing substrate 230, providing thermal lid 240 and bonding silicon die and substrate 250. FIG. 4A shows providing spacer 410 not previously shown. However, FIG. 4A does not show the step of placing die interface on silicon die 260 as previously shown in FIG. 2A (and FIG. 2B and FIG. 2C). Providing spacer 410 is shown occurring before bonding silicon die and substrate 250. But providing spacer 410 can occur at another suitable time in the method.

Figure 4B:
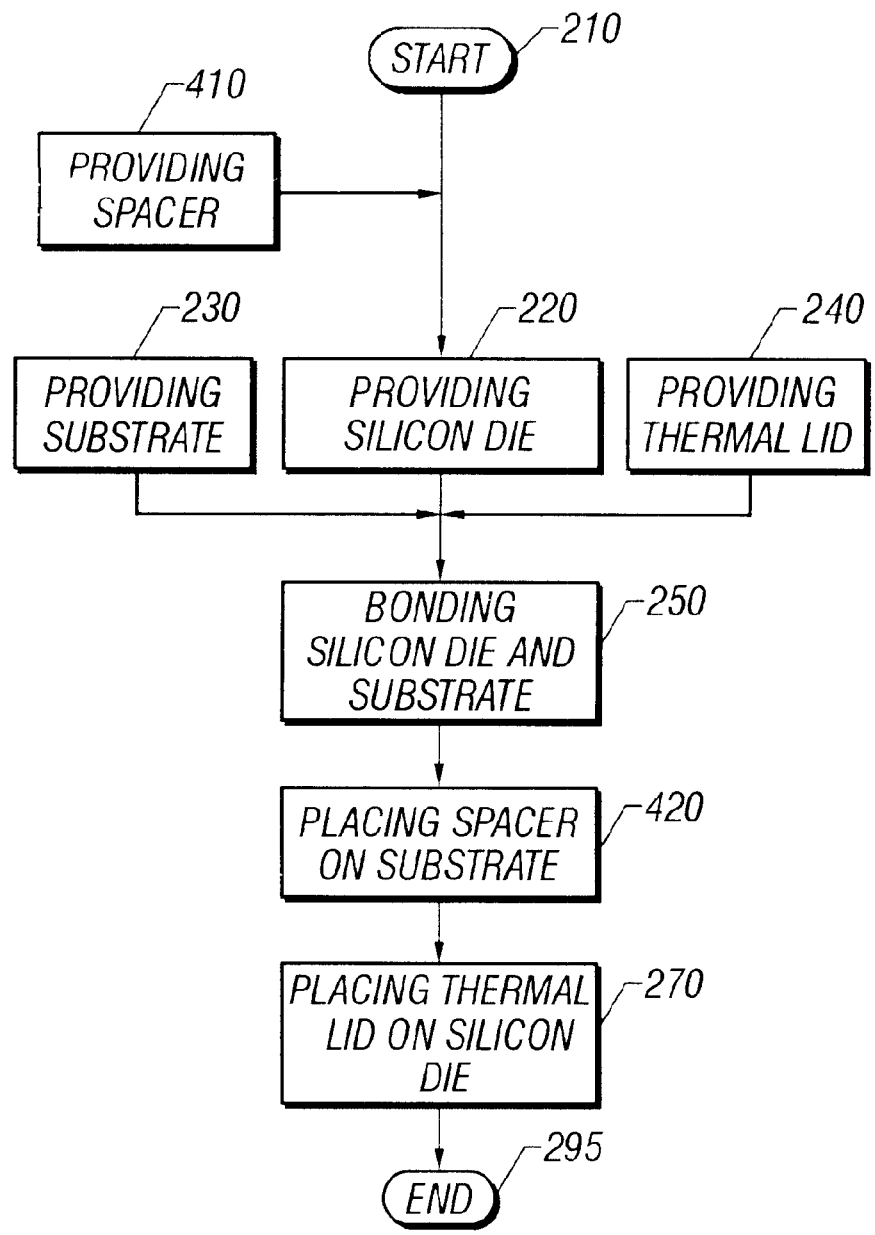
FIG. 4B depicts the logical process as previously shown in FIG. 4A and placing the spacer on the substrate and placing the thermal lid on the silicon die in separate steps.

Still referring to FIG. 4A, the method can proceed from providing spacer 410 to providing substrate 230, providing silicon die 220 and providing thermal lid 240 as discussed previously (refer to FIG. 2A). From providing substrate 230, providing silicon die 220 and providing thermal lid 240 the method proceeds to bonding silicon due and substrate, 250. From bonding silicon die and substrate the method proceeds to placing the spacer on the substrate and placing the thermal lid on the silicon die, 415. The thermal lid and the spacer can be placed as one component on the substrate. (As shown in FIG. 4B, placing the spacer on the substrate and placing thermal lid on the silicon die can occur separately.) Operably disposing the spacer on the substrate positions the spacer adjacent to the silicon die. Still referring to FIG. 4A, after the spacer is placed on the substrate and thermal lid is placed on the silicon die (415) the process ends, 295.

FIG. 4B depicts the method as shown in FIG. 4A, but placing the spacer on the substrate (420) and placing the thermal lid on the silicon die (270) in separate steps. (In comparison, as shown in FIG. 4A the thermal lid and spacer can be placed contemporaneously.) After bonding the silicon die and substrate (250) the method can proceed to placing the spacer on the substrate, 420. From placing spacer on the substrate (420) the method can proceed to placing the thermal lid on the silicon die, 270. From placing the thermal lid on the silicon die (270) the method can end, 295.

Figure 4C:
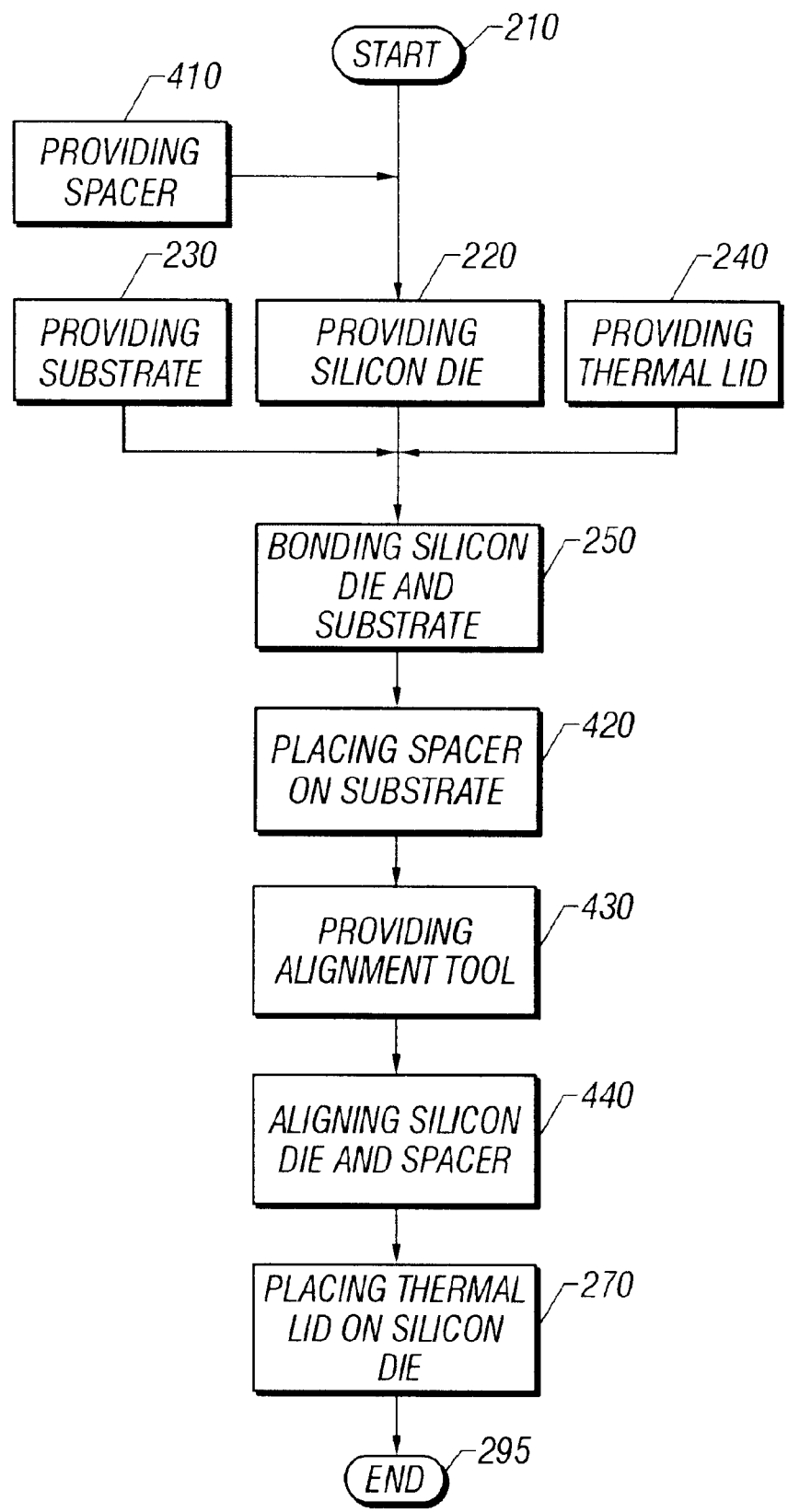
FIG. 4C depicts the logical process (as previously shown in FIG. 4A) with the additional logical step of aligning the silicon die and spacer.

FIG. 4C depicts the logical steps of using an alignment tool to align the silicon die and a spacer. Thus, FIG. 4C depicts logical steps previously depicted in FIG. 4A (and FIG. 4B) such as providing substrate 230, providing silicon die 220 and providing thermal lid 240. However, FIG. 4C depicts two additional steps not shown in FIG. 4A or FIG. 4B. Specifically, FIG. 4C depicts providing alignment tool, 430. Providing alignment tool 430 can include providing a tool such as the tool shown in FIG. 5A. Alternately, providing alignment tool 430 can include an alignment tool that performs a similar function to the alignment tool shown in FIG. 5A. From placing spacer on substrate (step 420, previously shown in FIG. 4B), the method can proceed to providing alignment tool, 430. After providing alignment tool 430 the alignment tool is used to align the silicon die and spacer, 440. As shown in FIG. 4C, aligning the silicon die and spacer can be accomplished after placing the spacer on the substrate (420) but before placing the thermal lid on the silicon die (270). Other steps in FIG. 4C, such as placing thermal lid on silicon die (270) are as previously described in FIG. 4B. After placing the thermal lid on the silicon die (270) the method can stop, 295.

Figure 5A:
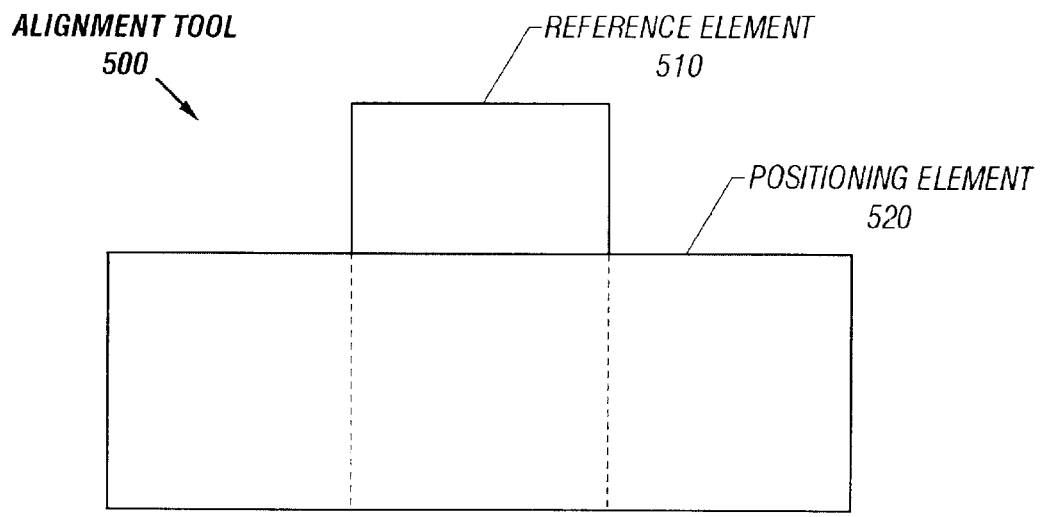
FIG. 5A is an elevation drawing of an alignment tool.
Figure 5B:
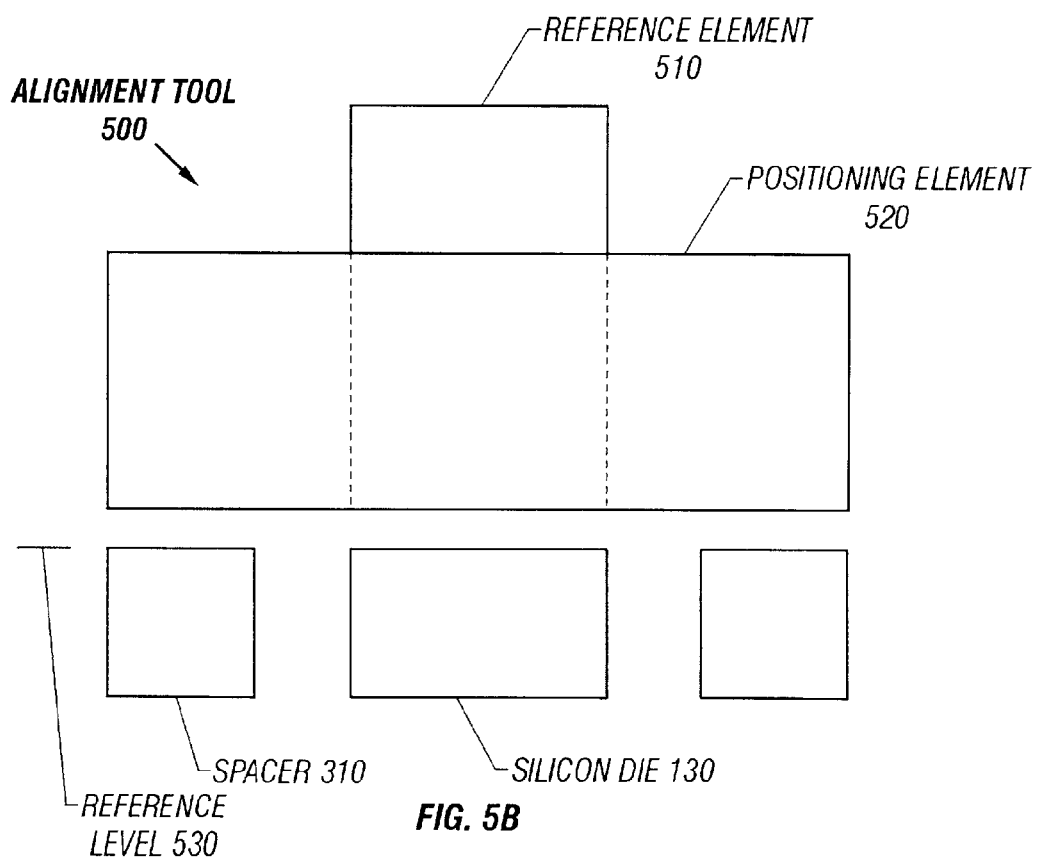
FIG. 5B is an elevation view of an alignment tool (as previously shown in FIG. 5A) and also showing a spacer and a silicon die.

FIG. 5A to FIG. 5D depict alignment tool 500, which can be used to align a silicon die with a spacer. As shown in FIG. 5A, alignment tool 500 can include reference element 510 and positioning element 520. Aligning the silicon die and spacer can be accomplished in various methods. For example, aligning a silicon die and a spacer can begin by bringing a reference element (such as reference element 510 shown in FIG. 5A) into contact with the silicon die. Now referring to FIG. 5B, spacer 310 and silicon die 130 are shown. Using alignment tool 500 is intended to align silicon die 130 and spacer 310 at the predetermined height variance (which can be a zero variance), such as reference level 530. Aligning silicon die 130 and spacer 310 at the predetermined height variance allows a thermally conductive lid (now shown, previously shown in FIG. 1) to be installed without use of a die interface material (not shown, previously shown in FIG. 1).

Figure 5C:
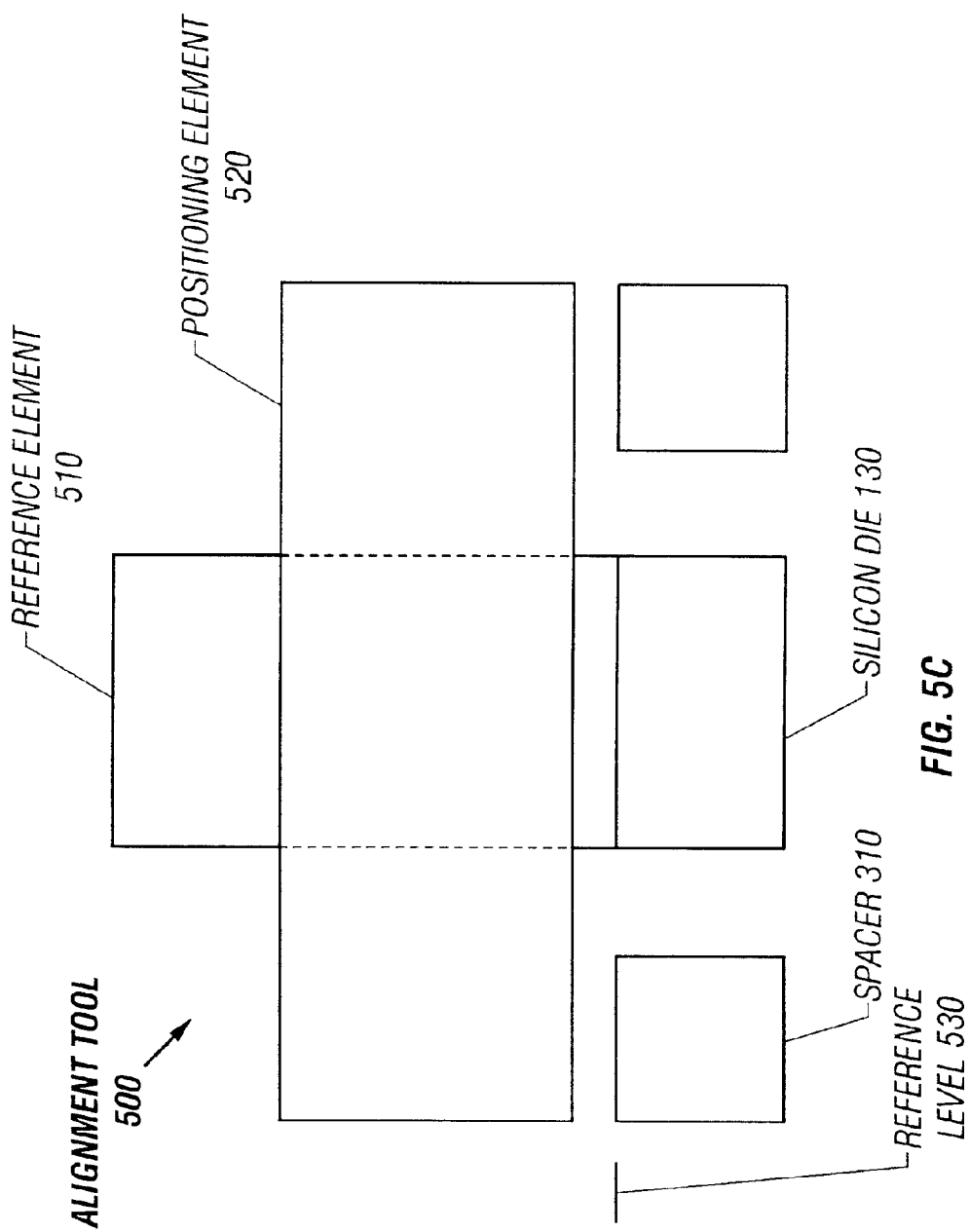
FIG. 5C is an elevation view of a spacer tool (previously shown in FIG. 5A) depicting the reference element moved in the vertical direction.
Figure 5D:
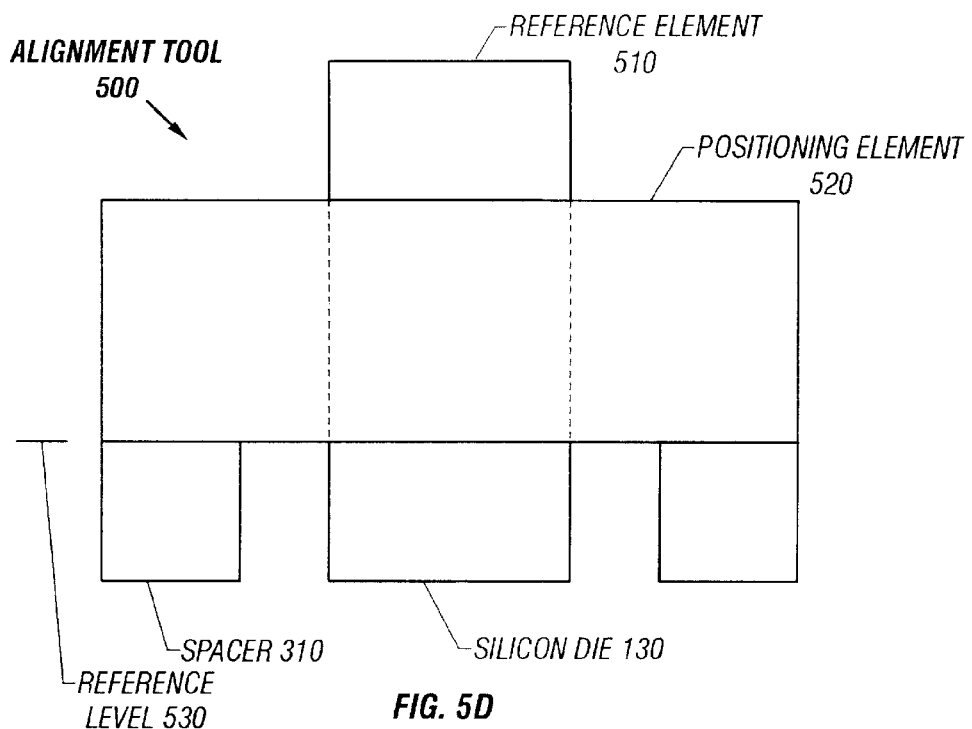
FIG. 5D is an elevation drawing of an alignment tool showing the positioning element moved to a predetermined height variance (including a zero variance) between the positioning element and the reference element.

Now refer to FIG. 5C which shows reference element 510 moved vertically until reference element 510 comes into contact with silicon die 130. Bringing reference element 510 into contact with the silicon die establishes reference level, 530. Establishing reference level 530 limits the movement of positioning element 520. Now referring to FIG. 5D, positioning element 520 is also moved vertically until limited by the position of reference element 510. As shown in FIG. 5D, positioning element 520 contacts a surface of spacer 310 and brings spacer 310 into the correct plane (such as reference level 530) to be aligned with silicon die 130. Bringing spacer 310 and silicon die 130 into correct alignment allows sufficient surface contact between a thermal lid (previously shown in FIG. 1) and a silicon die allowing efficient heat transfer without use of a die interface (as shown in FIG. 1).

Figure 5E:
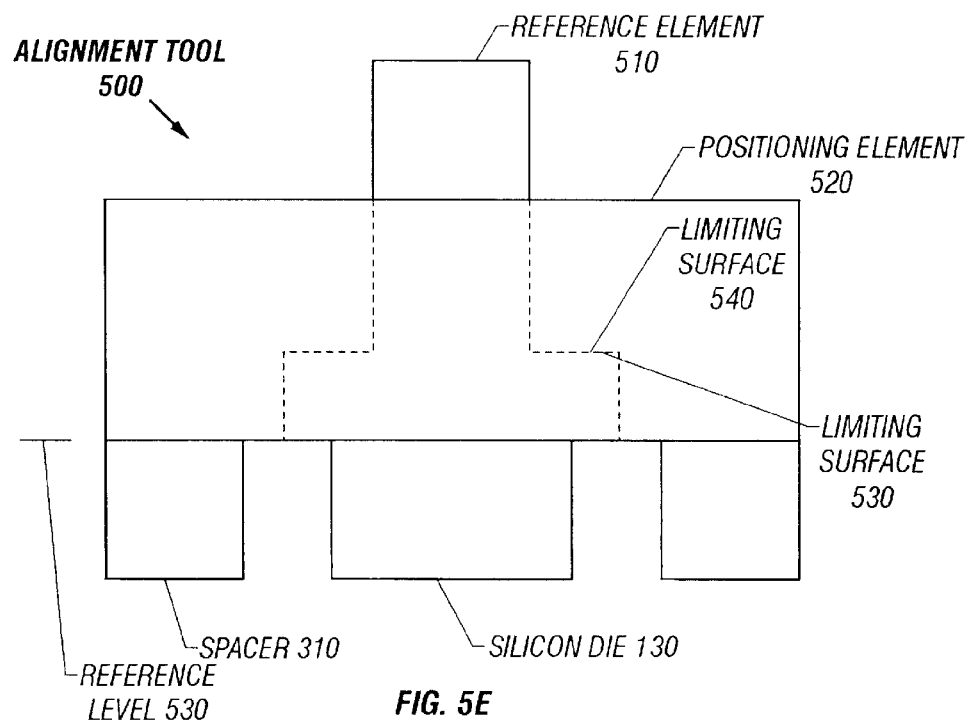
FIG. 5E is an elevation view of an alignment tool (previously shown in FIG. 5A) further depicting a limiting surface of the reference element and a limiting surface of the positioning element.

Now refer to FIG. 5E, which depicts an embodiment of alignment tool 500. FIG. 5E depicts limiting surface 540 of positioning element 520 and limiting surface 550 of reference element 510. As shown in FIG. 5E, limiting surface 540 is integral to positioning element 520. Limiting surface 550 is integral to reference element 510. Thus, when reference element contacts a surface of silicon die 130, limiting surface 550 is located at a predetermined distance from reference level, 530. Thus, positioning element 520 can move vertically until the positioning element comes into contact with a surface of spacer 310. When positioning element 520 comes into contact with a surface of spacer 310, positioning element 520 can continue to move downward until limiting surface 520 contacts limiting surface 550. When limiting surface 550 contacts limiting surface 540, spacer 310 and silicon die 130 are aligned with respect to predetermined height variance (including a zero variance), such as reference level 530.

Figure 1B:
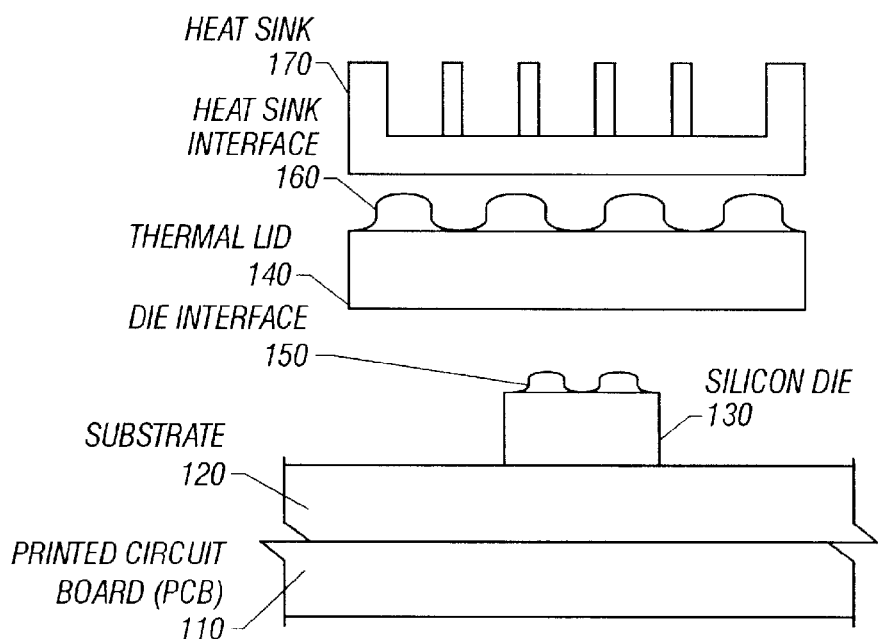
FIG. 1B depicts the related art of placing an organic thermal interface material on a silicon layer (as previously shown in FIG. 1A) using a zero-cavity thermal lid.
Figure 1C:
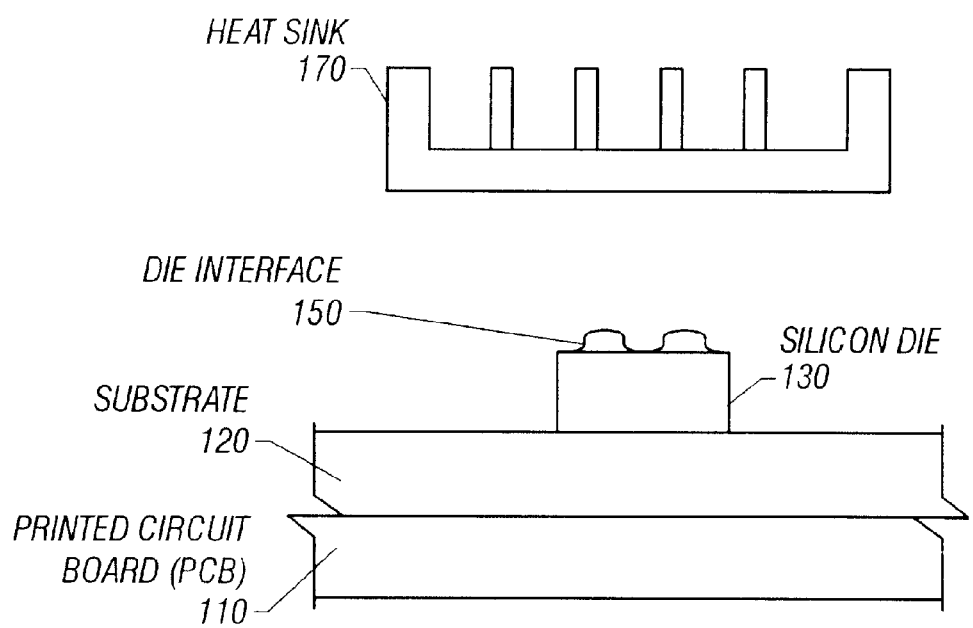
FIG. 1C also depicts the related art of facilitating heat transfer from a silicon die without thermal lid or heat sink interface material.

Alignment of spacer 310 and silicon die 130 with reference level 530 allows thermal lid 140 to be positioned on silicon die 130 (as shown in FIG. 1) without die interface material 150 (as shown in FIG. 1). Omitting die interface material 150 (as shown in FIG. 1) allows increased heat conduction from silicon die 130 to ambient by reducing the thermal resistance. Use of an alignment tool can facilitate omitting die interface material 150 (previously shown in FIG. 1).

An Example of a Computer System

The present disclosure is applicable to any integrated circuit including data processing systems. Integrated circuits may be found in many components of a typical computer system, for example a central processing unit, memory, cache, audio controller, network interface, I/O controller and I/O device as shown in the example below. Integrated circuits are found in other components within a computer system such as a display monitor, keyboard, floppy and hard disk drive, DVD drive, CD-ROM and printer. However, the example of a computer system is not taken to be limiting. Integrated circuits are ubiquitous and are found in other electrical systems such as stereo systems and mechanical systems including automobiles and aircraft.

Figure 6:
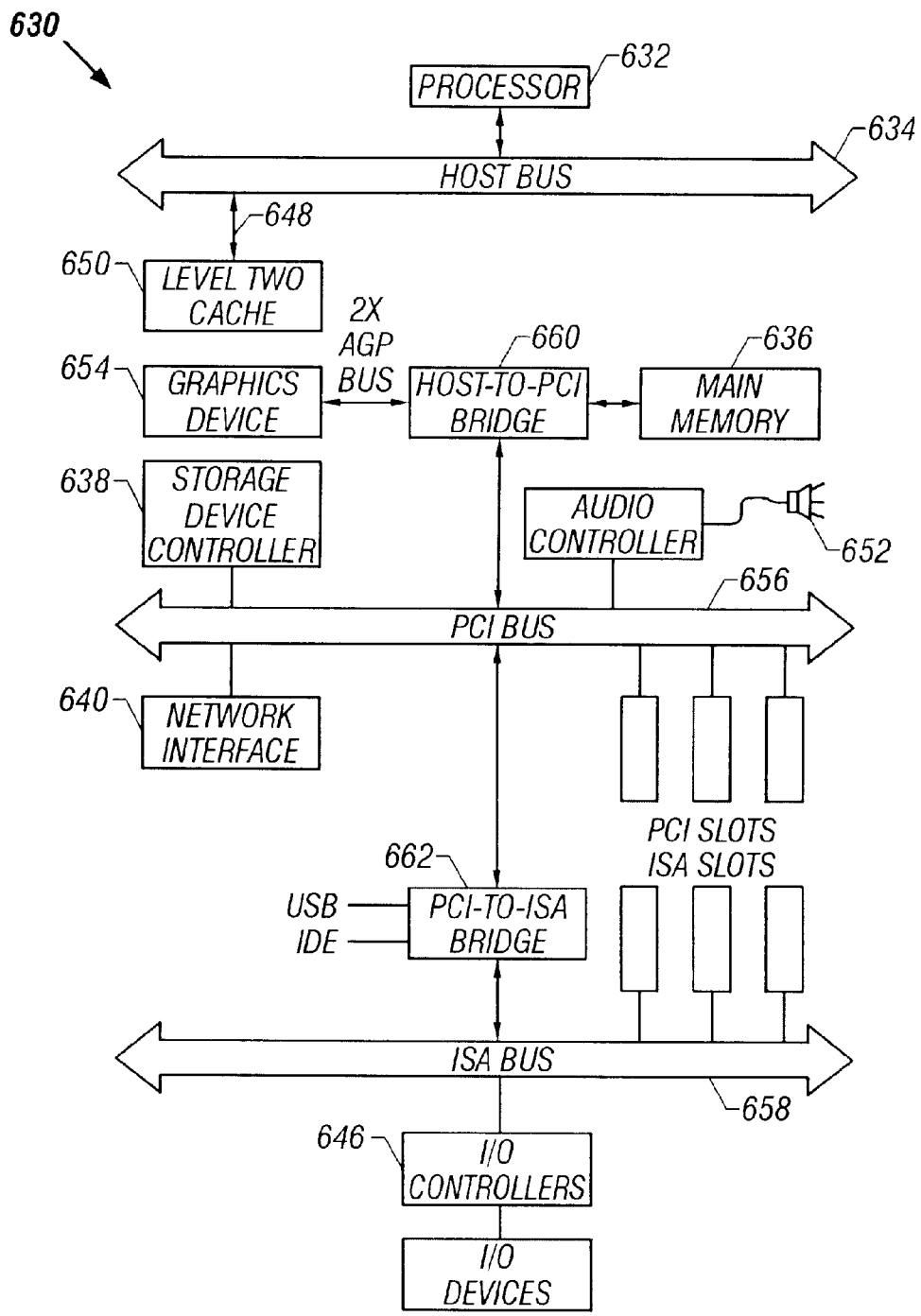
FIG. 6 is a block diagram of a computer system. The computer system incorporates various components (central processing unit, memory, etc.) which are integrated circuits which may be manufactured fabricated using the method taught.

Referring to FIG. 6, computer system 630 includes central processing unit (CPU) 632 connected by host buss 634 to various components including main memory 636, storage device controller 638, network interface 640, audio and video controllers 642, and input/output devices 644 connected via input/output (I/O) controllers 646.

Typically computer system 630 also includes cache memory 650 to facilitate quicker access between processor 632 and main memory 636. I/O peripheral devices often include speaker systems 652, graphics devices 654, and other I/O devices 644 such as display monitors, keyboards, mouse-type input devices, floppy and hard disk drives, DVD drives, CD-ROM drives, and printers. Many computer systems also include network capability, terminal devices, modems, televisions, sound devices, voice recognition devices, electronic pen devices, and mass storage devices such as tape drives. The number of devices available to add to personal computer systems continues to grow, however computer system 630 may include fewer components than shown in FIG. 6 and described herein. The peripheral devices usually communicate with processor 632 over one or more buses 634, 656, 658, with the buses communicating with each other through the use of one or more bridges 660, 662.

Those of skill in the art will recognize that, based upon the teachings herein, several modifications may be made to the embodiments shown in FIGS. 1–6. For example, those skilled in the art will recognize that incorporating integrated circuits manufactured by the process shown in electrical systems other than computers systems is incorporated in the spirit and scope of the invention.

While particular embodiments of the present invention have been shown and described, it will be recognized to those skilled in the art that, based upon the teachings herein, further changes and modifications may be made without departing from this invention and its broader aspects, and thus, the appended claims are to encompass within their scope all such changes and modifications as are within the true spirit and scope of this invention.

What is claimed is:

1. A method of facilitating alignment of a silicon die during manufacture of an integrated circuit package, comprising:

bonding a silicon die to a substrate;

disposing a spacer on the substrate; and, using an alignment tool to align the spacer with the silicon die, the alignment tool including a reference element to align the spacer with the silicon die such that the silicon die and the spacer are aligned at a predetermined height variance; and placing a thermal conductor on the silicon die without using a die interface.

2. The method as recited in claim 1, wherein the alignment tool further comprises a positioning element to align the spacer with the silicon die to enable aligning the spacer with the silicon die such that the silicon die and the spacer are aligned at the predetermined height variance.

3. The method as recited in claim 1, wherein the spacer is non-metallic.

4. The method as recited in claim 1, further comprising:

disposing a heat sink interface material on the thermal conductor; and disposing a heat sink on the heat sink interface material.

5. The method as recited in claim 4, wherein the thermal conductor is a thermally conductive lid.

6. The method as recited in claim 4, wherein the thermal conductor is a heat sink.

7. A method of facilitating alignment of a silicon die during manufacture of an integrated circuit package, comprising:

bonding a silicon die to a substrate;

disposing on the substrate a means for maintaining a spacing between a thermal conductor and the substrate;

using an alignment tool to align the means for maintaining the spacing and the silicon die, the means for maintaining a spacing between the thermal conductor and the substrate including a reference element to align the spacer with the silicon die such that the silicon die and the spacer are aligned at a predetermined height variance; and placing the thermal conductor on the silicon die without using a die interface.

8. The method as recited in claim 7, wherein the means for maintaining a spacing between the thermal conductor and the substrate includes a positioning element to enable aligning the spacer with the silicon die such that the silicon die and the spacer are aligned at the predetermined height variance.

9. The method as recited in claim 7, wherein the means for maintaining a spacing between the thermal conductor and the substrate is substantially rectangular.

10. The method as recited in claim 7, further comprising:

disposing a heat sink interface material on the thermal conductor; and disposing a heat sink on the heat sink interface material.

11. The method as recited in claim 7, wherein the thermal conductor is a theramally conductive lid.

12. The method as recited in claim 7, wherein the thermal conductor is a heat sink.

13. A method of facilitating alignment of a silicon die during manufacture of an integrated circuit package, comprising:

bonding a silicon die to a substrate;

disposing on the substrate a means for transferring force from a thermal conductor to the substrate;

using an alignment tool to align the means for transferring force with the silicon die, the alignment tool including a reference element to enable aligning the spacer with the silicon die such that the silicon die and the spacer are aligned at a predetermined height variance; and placing a thermal conductor on the silicon die without using a die interface.

14. The method as recited in claim 13, wherein the means for transferring force includes a positioning element to enable aligning the spacer with the silicon die such that the silicon die and the spacer are aligned at the predetermined height variance.

15. The method as recited in claim 13, wherein the thermal conductor is a heat sink.

16. The method as recited in claim 13, wherein the thermal conductor is a thermally conductive lid.

17. An apparatus to facilitate alignment of a silicon die during manufacture of an integrated circuit package, comprising:

a silicon die bonded to a substrate;

a spacer, wherein the spacer is operably disposed on the substrate;

an alignment tool, the alignment tool including a reference element to align the spacer with silicon die such that the silicon die and the spacer are aligned at a predetermined height variance, the alignment tool enabling the placing of a thermal conductor on the silicon die without using a die interface.

18. The apparatus as recited in claim 17, wherein the alignment tool further comprises a positioning element to enable aligning the spacer with the silicon die such that the silicon die and the spacer are aligned at the predetermined height variance.

* * * * *